(12) United States Patent
Miki et al.

(10) Patent No.: US 11,611,278 B2
(45) Date of Patent: Mar. 21, 2023

(54) POWER CONVERSION CIRCUIT MODULE

(71) Applicant: Murata Manufacturing Co., Ltd., Kyoto-fu (JP)

(72) Inventors: Osamu Miki, Nagaokakyo (JP); Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 289 days.

(21) Appl. No.: 17/129,874

(22) Filed: Dec. 21, 2020

(65) Prior Publication Data

US 2021/0111626 A1 Apr. 15, 2021

Related U.S. Application Data

(63) Continuation of application No. PCT/JP2019/008442, filed on Mar. 4, 2019.

(30) Foreign Application Priority Data

Aug. 20, 2018 (JP) .............................. JP2018-153793

(51) Int. Cl.
*H02M 3/158* (2006.01)
*H02M 1/42* (2007.01)
(Continued)

(52) U.S. Cl.
CPC ............. *H02M 3/158* (2013.01); *H02M 1/42* (2013.01); *H02M 3/003* (2021.05);
(Continued)

(58) Field of Classification Search
None
See application file for complete search history.

(56) References Cited

U.S. PATENT DOCUMENTS

| 6,181,590 B1 * | 1/2001 | Yamane ................ H01L 25/162 |
| | | 257/E25.03 |
| 2017/0194871 A1 * | 7/2017 | Coteus .................. H02M 3/003 |

FOREIGN PATENT DOCUMENTS

| DE | 19959171 A * | 12/2000 | ........... H01L 25/162 |
| DE | 102019127441 A1 * | 4/2020 | ............. B60L 50/66 |

(Continued)

OTHER PUBLICATIONS

International Search Report issued in PCT/JP2019/008442; dated May 14, 2019.
Written Opinion issued in PCT/JP2019/008442; dated May 14, 2019.

*Primary Examiner* — Matthew V Nguyen
(74) *Attorney, Agent, or Firm* — Studebaker & Brackett PC (57) ABSTRACT

Power line patterns are, together with a ground pattern, provided separately from control line patterns. The power line pattern is formed at first and second major surfaces of a circuit board. When the circuit board is viewed in plan view, the power line pattern and the power line pattern form a line structure in which the power line pattern and the power line pattern are in parallel with and opposite to each other and the power line pattern is positioned under the power line pattern. The circuit board includes a dielectric between the power line pattern and the power line pattern. These together form an equivalent capacitor and the magnetic flux induced by the current flowing through the power line pattern and the magnetic flux induced by the current flowing through the power line pattern cancel each other out.

20 Claims, 6 Drawing Sheets

(51) Int. Cl.
*H05K 1/02* (2006.01)
*H02M 3/00* (2006.01)
*H02M 1/00* (2006.01)

(52) U.S. Cl.
CPC ......... *H05K 1/0231* (2013.01); *H05K 1/0265* (2013.01); *H02M 1/0022* (2021.05); *H05K 2201/10015* (2013.01)

(56) References Cited

FOREIGN PATENT DOCUMENTS

| | | |
|---|---|---|
| JP | H07-045962 A | 2/1995 |
| JP | 2010-148231 A | 7/2010 |
| JP | 2013-058646 A | 3/2013 |
| JP | 2017-127084 A | 7/2017 |
| WO | 2015019519 A1 | 2/2015 |
| WO | WO-2020035967 A1 * | 2/2020 ......... H01F 17/0006 |

\* cited by examiner

FIG. 6B
(PRESENT APPLICATION)

FIG. 6C
(COMPARATIVE EXAMPLE)

POWER CONVERSION CIRCUIT MODULE

CROSS-REFERENCE TO RELATED APPLICATIONS

This application claims benefit of priority to International Patent Application No. PCT/JP2019/008442, filed Mar. 4, 2019, and to Japanese Patent Application No. 2018-153793, filed Aug. 20, 2018, the entire contents of each are incorporated herein by reference.

BACKGROUND

Technical Field

The present disclosure relates to a power conversion circuit module including a switching element for power conversion.

Background Art

Currently, various electronic devices including a power supply circuit are widely used. For such electronic devices, it is desired to suppress effects of noise caused by a power supply circuit on other electronic components of the electronic device and external conditions outside the electronic device.

For example, Japanese Unexamined Patent Application Publication No. 7-45962 describes a multilayer printed circuit board developed in consideration of a pattern for handling radio-wave related problems. In the multilayer printed circuit board described in Japanese Unexamined Patent Application Publication No. 7-45962, the power layer and ground layer coupled to a component that causes radio frequency noise are isolated from the power layer and ground layer for other electronic components.

SUMMARY

As electronic devices are downsized, power conversion circuit modules are required to be downsized. To downsize power conversion circuit modules, a switching element for power conversion and a power line pattern are arranged close to each other. In this case, switching noise caused by the switching element is additionally transferred to the power line pattern, which results in the disturbance of supply voltage.

However, known configurations including the configuration of Japanese Unexamined Patent Application Publication No. 7-45962 cannot hinder the disturbance of supply voltage due to such switching noise additionally transferred to the power line pattern.

Accordingly, the present disclosure provides a small-size power conversion circuit module capable of hindering the disturbance of supply voltage due to switching noise additionally transferred to a power line pattern.

A power conversion circuit module according to the present disclosure includes a switching element for power conversion, an inductor for power conversion, an input smoothing capacitor configured to smoothen an input current and an output smoothing capacitor configured to smoothen a switching current, a control IC configured to control the switching element, and a circuit board having a first major surface at which the switching element and the control IC is mounted and a second major surface different from and opposite to the first major surface.

The circuit board has a power line pattern electrically connecting the switching element, the inductor, the input smoothing capacitor, and the output smoothing capacitor and forming a current path of a power conversion circuit and a control line pattern electrically connecting the control IC and a control terminal of the switching element.

The power line pattern is, together with a ground pattern, provided separately from the control line pattern. The power line pattern includes an outward power line conductor pattern formed at the first major surface and a return power line conductor pattern formed at the second major surface. When the circuit board is viewed in plan view, the outward power line conductor pattern and the return power line conductor pattern form a power line structure in which the outward power line conductor pattern and the return power line conductor pattern are in parallel with and opposite to each other and the return power line conductor pattern is positioned under the outward power line conductor pattern. The circuit board includes a dielectric between the outward power line conductor pattern and the return power line conductor pattern. The outward power line conductor pattern, the return power line conductor pattern, and the dielectric together form an equivalent capacitor electrically in parallel with the input smoothing capacitor or the output smoothing capacitor. The magnetic flux induced by the current flowing through the outward power line conductor pattern and the magnetic flux induced by the current flowing through the return power line conductor pattern cancel each other out.

With this configuration, it is possible to hinder electromagnetic field coupling between the power line pattern and the control line pattern via the ground pattern. Additionally, with this configuration, the outward power line conductor pattern, the return power line conductor pattern, the magnetic field induced by the current flowing through the outward power line conductor pattern, and the magnetic field induced by the current flowing through the return conductor pattern are in antiphase, and as a result, high frequency switching noise, which is common mode noise, is canceled out.

The present disclosure can reduce the module size and also hinder the disturbance of supply voltage due to switching noise additionally transferred to a power line pattern.

DETAILED DESCRIPTION

Figure 1:
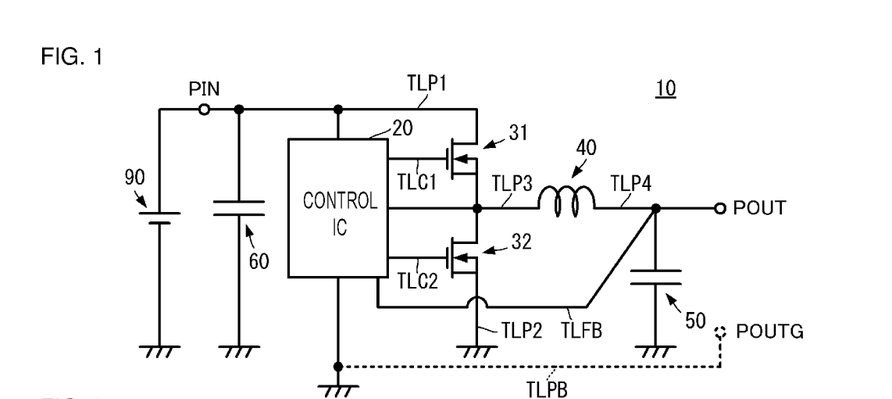
FIG. 1 is an equivalent circuit diagram of a power conversion circuit module 10 according to a first embodiment of the present disclosure.
Figure 2:
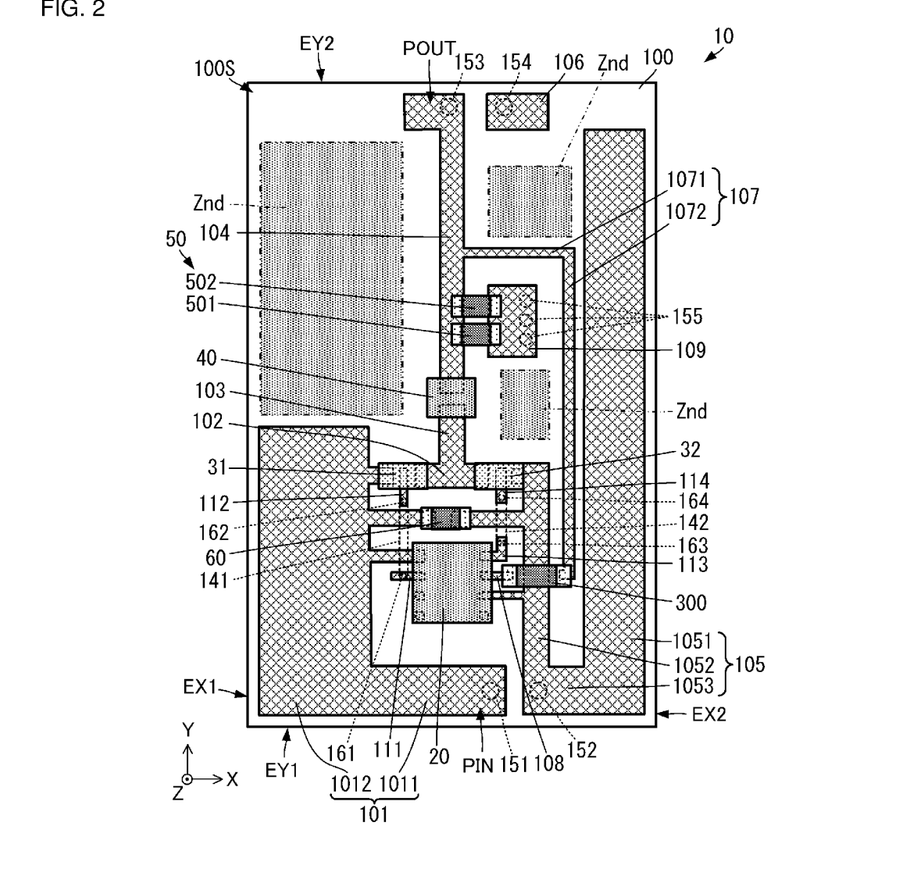
FIG. 2 is a plan view illustrating a structure of the power conversion circuit module.
Figure 3A:
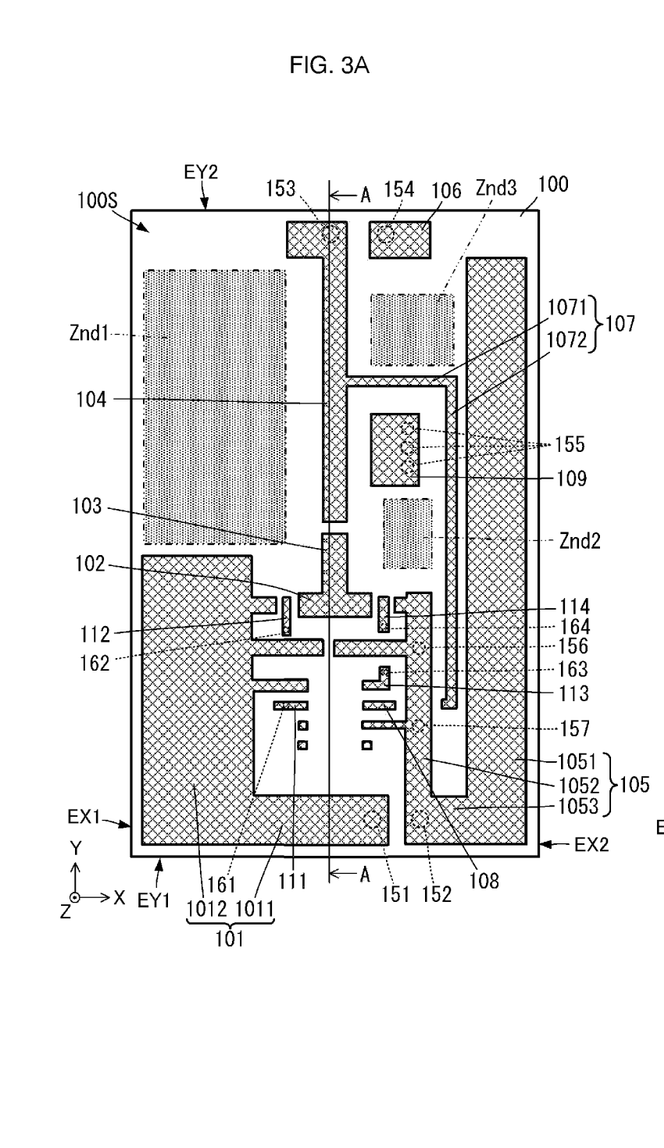
FIG. 3A is a plan view illustrating conductor patterns at a first major surface of a circuit board of the power conversion circuit module.
Figure 3B:
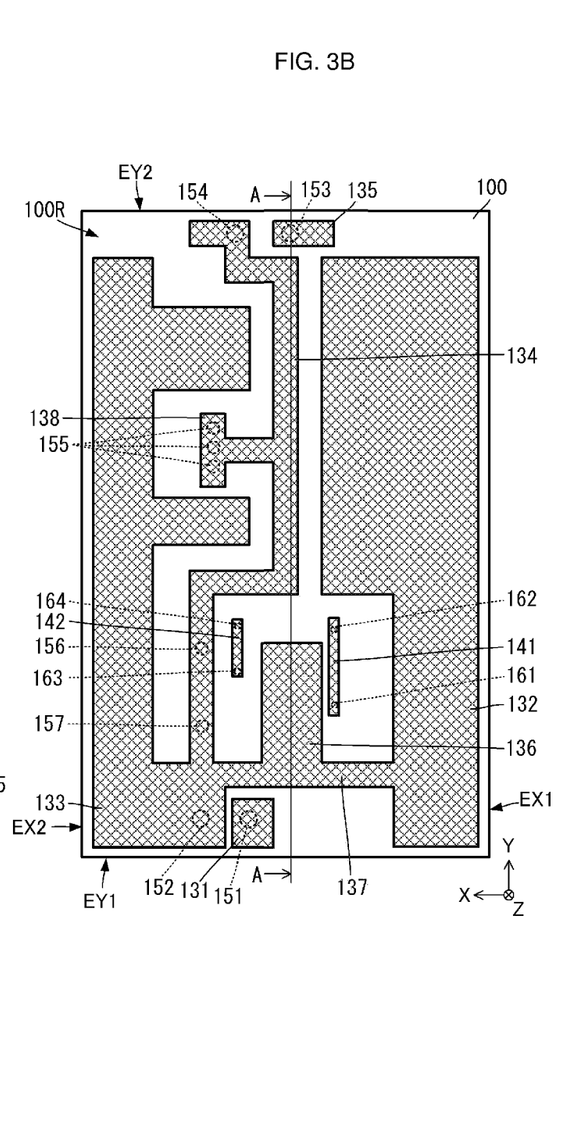
FIG. 3B is a plan view illustrating conductor patterns at a second major surface of the circuit board.
Figure 4:
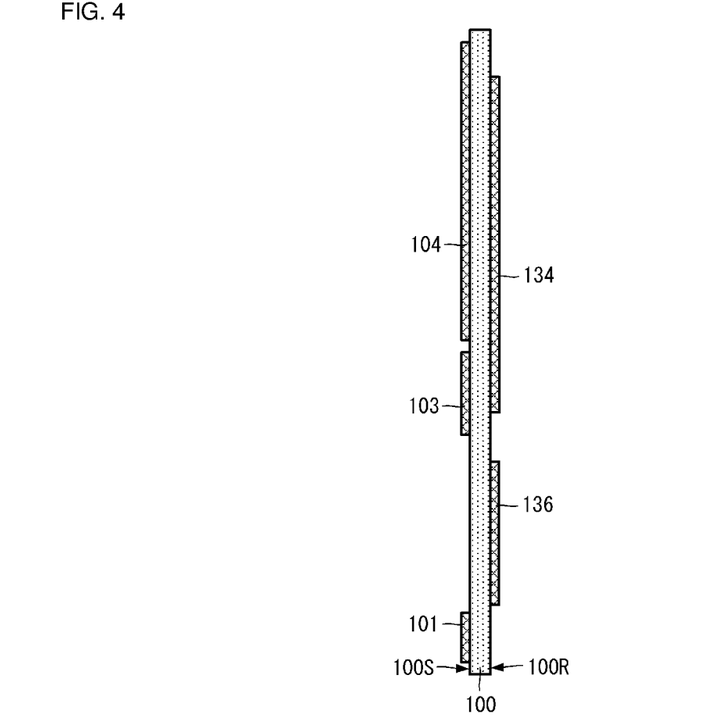
FIG. 4 is a sectional view of the circuit board of the power conversion circuit module.
Figure 5A:
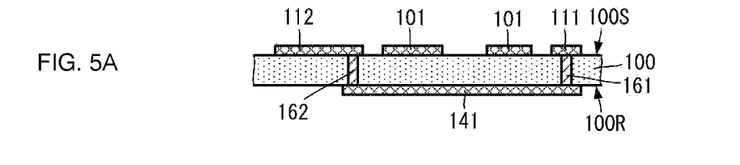
FIGS. 5A and 5B are fragmentary sectional views illustrating bypass structures of the conductor patterns sectioned in a thickness direction.
Figure 5B:
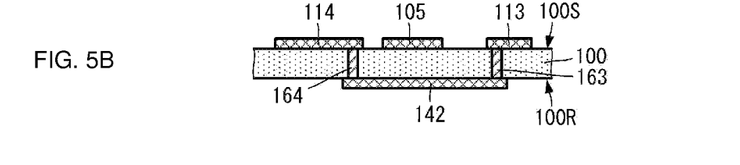
Figure 5C:
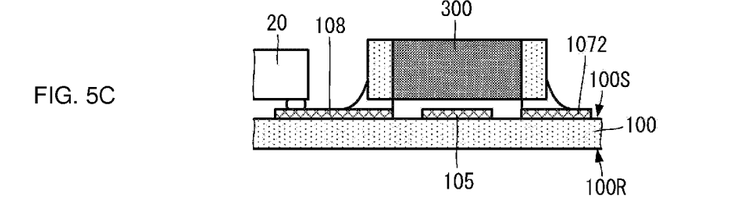
FIG. 5C is a fragmentary sectional view illustrating a bypass structure using a jumper chip sectioned in the thickness direction.

A power module according to embodiments of the present disclosure will be described with reference to the drawings. FIG. 1 is an equivalent circuit diagram of a power conversion circuit module 10 according to a first embodiment of the present disclosure. FIG. 2 is a plan view illustrating a structure of the power conversion circuit module 10. FIG. 3A is a plan view illustrating conductor patterns at a first major surface 100S of a circuit board 100 of the power conversion circuit module 10. FIG. 3B is a plan view illustrating conductor patterns at a second major surface 100R of the circuit board 100. FIG. 4 is a sectional view of the circuit board 100 of the power conversion circuit module 10. FIGS. 5A and 5B are fragmentary sectional views illustrating bypass structures of the conductor patterns sectioned in a thickness direction. FIG. 5C is a fragmentary sectional view illustrating a bypass structure using a jumper chip sectioned in the thickness direction.

Firstly, for ease of understanding of the description of features of the power conversion circuit module 10 according to the present embodiment, a circuit configuration will be described with reference to FIG. 1.

As illustrated in FIG. 1, the power conversion circuit module 10 includes a control IC 20, switching elements 31 and 32, an inductor 40, capacitors 50 and 60, an external-voltage input terminal PIN, and an output terminal POUT. Additionally, the power conversion circuit module 10 virtually includes a ground output terminal POUTG connected to a ground potential, in combination with the output terminal POUT. The switching elements 31 and 32 correspond to a "switching element for power conversion" of the present disclosure. The inductor 40 corresponds to an "inductor for power conversion" of the present disclosure. The capacitor 50 corresponds to an "output smoothing capacitor" of the present disclosure. The capacitor 60 corresponds to an "input smoothing capacitor" of the present disclosure.

The switching elements 31 and 32 are semiconductor switches for power supply such as field-effect transistors (FETs).

A power line pattern TLP1 connects the input terminal PIN, the control IC 20, and the drain of the switching element 31. An external DC power supply 90 is coupled to the input terminal PIN. One point of the power line pattern TLP1 between the input terminal PIN and a connection point to the control IC 20 is coupled to the ground (reference potential) via the capacitor 60. The capacitor 60 smoothens the input current from the external DC power supply 90.

A control line pattern TLC1 connects the control IC 20 and the gate (control terminal) of the switching element 31. A control line pattern TLC2 connects the control IC 20 and the gate (control terminal) of the switching element 32.

The control IC 20 is coupled to the ground via a grounding line.

A power line pattern TLP3 connects the source of the switching element 31 and the drain of the switching element 32. This power line pattern TLP3 is also coupled to the control IC 20.

The source of the switching element 32 is coupled to the ground via a power line pattern TLP2.

One end of the inductor 40 is coupled to the power line pattern TLP3. The other end of the inductor 40 is coupled to the output terminal POUT via a power line pattern TLP4.

One point of the power line pattern TLP4 is coupled to the ground (reference potential) via the capacitor 50. The capacitor 50 smoothens a switching current.

One point of the power line pattern TLP4 is coupled to the control IC 20 via a feedback line pattern (line pattern for sensing output voltage) TLFB.

Additionally, the ground output terminal POUTG is coupled, via a power line pattern TLPB, to the line pattern TLFB coupled to the ground from the control IC 20.

With this configuration, the control IC 20 controls the switching elements 31 and 32 to turn on/off. This determines the direct-current voltage at the output terminal POUT (output voltage). At this time, the control IC 20 senses the output voltage or current through the feedback line pattern TLFB, so that the control IC 20 adjusts the control of the switching elements 31 and 32. This operation maintains the output voltage at an almost constant level.

The power conversion circuit module 10 having such a circuit configuration is implemented by a structure illustrated in FIGS. 2, 3A, 3B, 4, and 5.

As illustrated in FIG. 2, the power conversion circuit module 10 includes the circuit board 100, the control IC 20, the switching elements 31 and 32, the inductor 40, capacitors 501 and 502, the capacitor 60, and a jumper chip 300. The capacitors 501 and 502 constitute the capacitor 50 illustrated in FIG. 1.

(Structure of Circuit Board 100)

As illustrated in FIGS. 3A and 3B, the circuit board 100 is a plate having the first major surface 100S and the second major surface 100R. The circuit board 100 is mainly formed of a dielectric. Various conductor patterns described later are formed at the first major surface 100S and the second major surface 100R of the circuit board 100. Additionally, a plurality of via-conductors for coupling conductor patterns at the first major surface 100S and conductor patterns at the second major surface 100R are formed in the circuit board 100. It should be noted that the circuit board 100 described in the present embodiment has the first major surface 100S as the front surface and the second major surface 100R as the back surface; however, the circuit board 100 can be implemented as a substrate formed by laminating dielectric layers at which conductor patterns are formed. The dielectric is an insulating plate made of glass fibers impregnated with an epoxy resin and used to form a glass composite substrate or a glass epoxy substrate; alternatively, the dielectric is an insulating plate made of a polyimide or polyester resin and used to form a resin substrate.

(Conductor Patterns of First Major Surface 100S)

As illustrated in FIG. 3A, conductor patterns 101 to 109 and 111 to 114 are formed at the first major surface 100S. One end and the other end of the conductor patterns in the following description denote an end and an opposite end in a direction in which each conductor pattern extends. This means that one end is one end in the extension direction and the other end is the other end in the extension direction unless otherwise stated.

The conductor pattern 101 has a first portion 1011 and a second portion 1012. The conductor pattern 101 is formed at an area close to a corner at which a one-side edge EX1 in an X direction of the circuit board 100 and another one-side edge EY1 in a Y direction meet. The first portion 1011 is formed near the one-side edge EY1 while extending in the X direction. The second portion 1012 is formed near the one-side edge EX1 while extending in the Y direction. The conductor pattern 101 is mostly wider than other conductor patterns described later. The conductor pattern 101 serves as the power line pattern TLP1.

The conductor pattern 102 is formed near an end portion of the conductor pattern 101 opposite to the one-side edge EY1 in the Y direction. The conductor pattern 102 extends in the X direction.

The conductor pattern 103 extends in the Y direction and has one end joined to the conductor pattern 102. The conductor pattern 103 extends toward an other-side edge EY2 in the Y direction with respect to the conductor pattern 102. The conductor patterns 102 and 103 constitute the power line pattern TLP3.

The conductor pattern 104 extends in the Y direction. One end of the conductor pattern 104 is spaced apart by a given distance from the other end of the conductor pattern 103. The other end of the conductor pattern 104 reaches close to the other-side edge EY2 of the circuit board 100 in the Y direction. The conductor patterns 104 and 103 are disposed at almost the same position in the X direction. The conductor pattern 104 serves as the power line pattern TLP4.

The conductor pattern 105 has a first portion 1051, a second portion 1052, and a third portion 1053. The first portion 1051 and the second portion 1052 extend in the Y direction while the third portion 1053 extends in the X direction. The first portion 1051 is formed near and along an other-side edge EX2 of the circuit board 100 in the X direction. The second portion 1052 is formed close to the middle of the circuit board 100 relative to the first portion 1051 in the X direction and spaced apart from the first portion 1051. One end of the second portion 1052 is positioned near the one-side edge EY1 in the Y direction and the other end is positioned at almost the same position as the position of the conductor pattern 102 in the Y direction. The third portion 1053 connects one end of the first portion 1051 and the one end of the second portion 1052. The first portion 1051 is wider than the second portion 1052. The conductor pattern 105 serves as a grounding conductor pattern. In addition, a portion close to the other end of the second portion 1052 of the conductor pattern 105 serves as the power line pattern TLP2.

The conductor pattern 106 is formed near the other-side edge EY2 of the circuit board 100 in the Y direction. The conductor pattern 106 is a rectangle when viewed in plan view. The conductor pattern 106 is spaced apart by a given distance from the conductor pattern 104 in the X direction. The conductor pattern 106 serves as a part of the ground output terminal POUTG.

The conductor pattern 107 has a first portion 1071 and a second portion 1072. The first portion 1071 extends in the X direction. The second portion 1072 extends in the Y direction. One end of the first portion 1071 is joined to the conductor pattern 104. Specifically, the first portion 1071 is joined to the conductor pattern 104 at a position close to the other end (end portion on the other-side edge EY2 side) of the conductor pattern 104. The other end of the first portion 1071 reaches close to the first portion 1051 of the conductor pattern 105. The other end of the first portion 1071 is joined to one end of the second portion 1072. The other end of the second portion 1072 reaches in the middle of the second portion 1052 of the conductor pattern 105 in the Y direction. The conductor pattern 107 forms a part of the feedback line pattern TLFB.

The conductor pattern 109 described later and an area for mounting electronic components are provided between the second portion 1072 of the conductor pattern 107 and the conductor pattern 104. This means that the second portion 1072 of the conductor pattern 107 and the conductor pattern 104 are spaced apart from each other by a given distance in the X direction. This distance is preferably, for example, about double or more of the width of the second portion 1072 of the conductor pattern 107 or the width of the conductor pattern 104.

The conductor pattern 108 extends in the X direction. The conductor pattern 108 is positioned opposite to the other end of the second portion 1072 of the conductor pattern 107 with respect to the second portion 1052 of the conductor pattern 105. The conductor pattern 108 forms a part of the feedback line pattern TLFB. This means that the feedback line pattern TLFB includes a break between the second portion 1072 of the conductor pattern 107 and the conductor pattern 108.

The conductor pattern 109 is a rectangle. The conductor pattern 109 is formed in an area surrounded by the conductor pattern 104 and the first portion 1071 and the second portion 1072 of the conductor pattern 107. The conductor pattern 109 serves as a grounding conductor pattern for the output capacitor 50.

The conductor pattern 111 extends in the X direction. The conductor pattern 111 is formed in an area surrounded by the conductor pattern 101 and the second portion 1052 of the conductor pattern 105. The conductor pattern 111 is formed at almost the same position as the position of the conductor pattern 108 in the Y direction. The conductor pattern 111 serves as a part of the control line pattern TLC1.

The conductor pattern 112 extends in the Y direction. The conductor pattern 112 is formed between the conductor pattern 101 and one end of the conductor pattern 102 in the X direction. The conductor pattern 112 serves as a part of the control line pattern TLC1.

The conductor pattern 113 extends in both the X direction and the Y direction. The conductor pattern 113 is formed near the conductor pattern 108. The conductor pattern 113 serves as a part of the control line pattern TLC2.

The conductor pattern 114 extends in the Y direction. The conductor pattern 114 is formed between the conductor pattern 102 and the second portion 1052 of the conductor pattern 105 in the X direction. The conductor pattern 114 serves as a part of the control line pattern TLC2.

A component-mounting area Znd1 is provided in an area surrounded by the conductor pattern 101 and the conductor pattern 104. A component-mounting area Znd2 is provided in an area surrounded by the conductor pattern 104, the second portion 1052 of the conductor pattern 105, the second portion 1072 of the conductor pattern 107, and the conductor pattern 109. A component-mounting area Znd3 is provided in an area surrounded by the conductor pattern 104, the first portion 1051 of the conductor pattern 105, the conductor pattern 106, and the first portion 1071 of the conductor pattern 107.

(Conductor Patterns of Second Major Surface 100R)

As illustrated in FIG. 3B, conductor patterns 131 to 138, 141, and 142 are formed at the second major surface 100R. The conductor patterns 131 to 138 correspond to a "ground pattern" of the present disclosure.

The conductor pattern 131 is a rectangle formed near the one-side edge EY1 of the circuit board 100. The conductor pattern 131 is positioned under the first portion 1011 of the conductor pattern 101 of the first major surface 100S when viewed in plan view. A via-conductor 151, which penetrates the circuit board 100 in the thickness direction, connects the conductor pattern 131 and the first portion 1011 of the conductor pattern 101.

The conductor pattern 132 is formed near the one-side edge EX1 of the circuit board 100 in the X direction while extending in the Y direction. One end of the conductor pattern 132 is close to the one-side edge EY1 of the circuit board 100 in the Y direction and the other end reaches close to the other-side edge EY2. An area of the conductor pattern 132 on the one-side edge EY1 side is positioned under the conductor pattern 101 of the first major surface 100S. Another area of the conductor pattern 132 on the other-side edge EY2 side is positioned under the component-mounting area Znd1 of the first major surface 100S.

The conductor pattern 133 is formed near the other-side edge EX2 of the circuit board 100 in the X direction while extending in the Y direction. One end of the conductor pattern 133 is close to the one-side edge EY1 of the circuit board 100 in the Y direction and the other end reaches close to the other-side edge EY2. The conductor pattern 133 is positioned under the first portion 1051 and the third portion 1053 of the conductor pattern 105 of the first major surface 100S. A via-conductor 152 connects a portion of the one end of the conductor pattern 133 and a joint between the second portion 1052 and the third portion 1053 of the conductor pattern 105 of the first major surface 100S.

The conductor pattern 134 mostly extends in the Y direction. The conductor pattern 134 is formed between the conductor pattern 132 and the conductor pattern 133 in the X direction of the circuit board 100. One end of the conductor pattern 134 is positioned near the other-side edge EY2 of the circuit board 100 in the Y direction. The other end of the conductor pattern 134 is joined to the conductor pattern 133. The conductor pattern 134 bends in some midpoint in the extension direction. The conductor pattern 104 serves as the power line pattern TLPB.

A portion of the conductor pattern 134 on the one end side (EY2 side) with respect to the bend is positioned under the conductor pattern 104 of the first major surface 100S as also illustrated in FIG. 4. Another portion of the conductor pattern 134 on the other end side (EY1 side) with respect to the bend is positioned under the second portion 1052 of the conductor pattern 105.

A via-conductor 154 connects the one end of the conductor pattern 134 and the conductor pattern 106 of the first major surface 100S. Via-conductors 156 and 157 connect the portion of the conductor pattern 134 on the other end side (EY1 side) with respect to the bend and the second portion 1052 of the conductor pattern 105.

The conductor pattern 135 is a rectangle formed near the other-side edge EY2 of the circuit board 100 in the Y direction. The conductor pattern 135 is positioned under the conductor pattern 104 of the first major surface 100S. A via-conductor 153 connects the conductor pattern 135 and the conductor pattern 104.

The conductor pattern 136 is a rectangle formed in an area surrounded by the conductor pattern 132, the bend of the conductor pattern 134, and the portion of the conductor pattern 134 on the other end side (EY1 side) with respect to the bend.

The conductor pattern 137 extends in the X direction and is joined to the conductor pattern 132, the conductor pattern 133, and the conductor pattern 136.

The conductor pattern 138 is a rectangle formed in an area surrounded by the portion of the conductor pattern 134 on the one end side (EY2 side) with respect to the bend and the conductor pattern 133. The conductor pattern 138 is joined to the conductor pattern 134. The conductor pattern 138 is positioned under the conductor pattern 109 of the first major surface 100S. A plurality of via-conductors 155 connect the conductor pattern 138 and the conductor pattern 109.

The conductor pattern 141 extends in the Y direction and is formed in an area surrounded by the conductor pattern 132, the conductor pattern 136, and the conductor pattern 137. The conductor pattern 141 serves as a part of the control line pattern TLC1.

As illustrated in FIG. 5A, one end of the conductor pattern 141 is positioned under the conductor pattern 111 of the first major surface 100S. A via-conductor 161 connects the one end of the conductor pattern 141 and the conductor pattern 111. The other end of the conductor pattern 141 is positioned under the conductor pattern 112 of the first major surface 100S. A via-conductor 162 connects the other end of the conductor pattern 141 and the conductor pattern 112. The conductor pattern 111, the via-conductor 161, the conductor pattern 141, the via-conductor 162, and the conductor pattern 112 serve as the control line pattern TLC1. With this configuration, the conductor pattern 141 constituting the control line pattern TLC1 intersects the second portion 1012 of the conductor pattern 101 constituting the power line pattern TLP1. This intersection corresponds to a "first intersection" of the present disclosure.

The conductor pattern 142 extends in the Y direction and is formed in an area surrounded by the conductor pattern 134, the conductor pattern 136, and the conductor pattern 137. The conductor pattern 142 serves as a part of the control line pattern TLC2.

As illustrated in FIG. 5B, one end of the conductor pattern 142 is positioned under the conductor pattern 113 of the first major surface 100S. A via-conductor 163 connects the one end of the conductor pattern 142 and the conductor pattern 113. The other end of the conductor pattern 142 is positioned under the conductor pattern 114 of the first major surface 100S. A via-conductor 164 connects the other end of the conductor pattern 142 and the conductor pattern 114. The conductor pattern 113, the via-conductor 163, the conductor pattern 142, the via-conductor 164, and the conductor pattern 114 serve as the control line pattern TLC2. With this configuration, the conductor pattern 142 constituting the control line pattern TLC2 intersects the second portion 1052 of the conductor pattern 105 constituting the power line pattern TLP1. This intersection corresponds to the "first intersection" of the present disclosure.

(Mounting Structure)

As illustrated in FIG. 2, the components are mounted on the circuit board 100 at which the conductor patterns described above are formed.

The control IC 20 is attached to the circuit board 100 such that given terminals of the control IC 20 are connected to the conductor pattern 101, the conductor pattern 111, the second portion 1052 of the conductor pattern 105, the conductor pattern 108, and the conductor pattern 113.

The switching element 31 is attached to the circuit board 100 such that the gate is connected to the conductor pattern 112, the drain is connected to the conductor pattern 111, and the source is connected to the conductor pattern 102.

The switching element 32 is attached to the circuit board 100 such that the gate is connected to the conductor pattern 114, the drain is connected to the conductor pattern 102, and the source is connected to the second portion 1052 of the conductor pattern 105.

The inductor 40 is attached to the circuit board 100 such that one terminal is connected to the conductor pattern 103 and the other terminal is connected to the conductor pattern 104.

The capacitors 501 and 502 are each attached to the circuit board 100 such that one terminal is connected to the conductor pattern 104 and the other terminal is connected to the conductor pattern 109.

The capacitor 60 is attached to the circuit board 100 such that one terminal is connected to the conductor pattern 101 and the other terminal is connected to the second portion 1052 of the conductor pattern 105. The capacitor 60 is positioned between the switching elements 31 and 32 and the control IC 20 in the Y direction of the circuit board 100. This structure leaves a space between the switching elements 31 and 32 and the control IC 20.

The jumper chip 300 is, for example, a 0Ω resistor. As illustrated in FIG. 5C, the jumper chip 300 is attached to the circuit board 100 such that one end is connected to the second portion 1072 of the conductor pattern 107 and the other end is connected to the conductor pattern 108. The jumper chip 300 connects both ends of the break of the feedback line pattern TLFB. Thus, the jumper chip 300 serves as an intersection ("second intersection" of the present disclosure) of the power line pattern TLP2 and the feedback line pattern TLFB.

With the structure described above, the power conversion circuit module 10 can achieve the following effects and advantages.

(1) The control line pattern TLC1 constituted by the conductor pattern 111, the via-conductor 161, the conductor pattern 141, the via-conductor 162, and the conductor pattern 112 is not coupled to the ground of any power line pattern. The control line pattern TLC2 constituted by the conductor pattern 113, the via-conductor 163, the conductor pattern 142, the via-conductor 164, and the conductor pattern 114 is not coupled to the ground of any power line pattern.

Thus, the control line patterns TLC1 and TLC2 are, together with the ground, provided electrically separately from the power line patterns, and as a result, it is possible to hinder electromagnetic field coupling between the control line patterns TLC1 and TLC2 and the power line patterns. Accordingly, it is possible to reduce the leakage of switch noise from the control line patterns TLC1 and TLC2 to the power line patterns and consequently to hinder the disturbance of output voltage (supply voltage) due to switching noise.

(2) The conductor pattern 104 of the first major surface 100S and the conductor pattern 134 of the second major surface 100R are arranged in parallel with each other; the conductor pattern 134 is positioned under the conductor pattern 104 when viewed in plan view. As such, the circuit board 100 formed of the dielectric is sandwiched between the power line patterns TLP4 and TLPB. As a result, a capacitor is formed in shunt connection to the power line patterns. In addition, the power line patterns TLP4 and TLPB serves as an inductor coupled in series with the power line patterns TLP4 and TLPB. This structure serves as a low pass filter formed of an equivalent LC filter between the inductor 40 and the output terminal POUT; the low pass filter is used for switching noise caused by switching operations. Thus, the switching noise at higher frequencies are reduced and the switching noise can be prevented from being outputted from the output terminal POUT.

The current flowing through the power line pattern TLP4 formed of the conductor pattern 104 is opposite in direction to the current flowing through the power line pattern TLPB formed of the conductor pattern 134; in other words, the power line pattern TLP4 is an outward conductor pattern and the power line pattern TLPB is a return conductor pattern. In addition, the conductor pattern 104 and the conductor pattern 134 are arranged in parallel with each other and the conductor pattern 134 is positioned under the conductor pattern 104 when viewed in plan view, such that a facing wiring structure is formed. As a result, the magnetic flux induced by the current flowing through the power line pattern TLP4 and the magnetic flux induced by the current flowing through the power line pattern TLPB cancel each other out, and thus, the propagating noise is reduced. Moreover, since the conductor pattern 134 is positioned under the conductor pattern 104, the size is reduced in comparison to the structure in which the conductor pattern 134 is not positioned under the conductor pattern 104. Consequently, the power conversion circuit module 10 can be downsized.

The conductor pattern 141 substantially perpendicularly crosses the second portion 1012 of the conductor pattern 101. As a result, the control line pattern TLC1 substantially perpendicularly crosses the power line pattern TLP1.

The conductor pattern 142 substantially perpendicularly crosses the second portion 1052 of the conductor pattern 105. As a result, the control line pattern TLC2 substantially perpendicularly crosses the power line pattern TLP1.

(3) The first portion 1071 of the conductor pattern 107 is perpendicular to the conductor pattern 104. As a result, power line pattern TLP4 and the feedback line pattern TLFB are perpendicular to each other close to their joint. This structure can prevent the switching noise of the power line pattern TLP4 from being spatially coupled to and additionally transferred to the feedback line pattern TLFB. Consequently, it is possible to avoid the adverse effect of switching noise on the control by the control IC 20 and consequently hinder the malfunction of the control IC 20. While the description here uses the pattern in which the power line pattern TLP4 and the feedback line pattern TLFB are perpendicular to each other, it is also possible to prevent the switching noise of the power line pattern TLP4 from being spatially coupled to and additionally transferred to the feedback line pattern TLFB when the power line pattern TLP4 crosses the feedback line pattern TLFB at an angle of, for example, 90°±about 45°.

Furthermore, the second portion 1072 of the conductor pattern 107 is spaced apart from the conductor pattern 104. Thus, although the power line pattern TLP4 and the feedback line pattern TLFB are arranged partially in parallel with each other, it is possible to further prevent the switching noise of the power line pattern TLP4 from being spatially coupled to and additionally transferred to the feedback line pattern TLFB. Consequently, it is possible to further avoid the adverse effect of switching noise on the control by the control IC 20 and consequently further hinder the malfunction of the control IC 20. The separation distance between the second portion 1072 of the conductor pattern 107 and the conductor pattern 104 is preferably about double or more of the conductor pattern width (for example, the width of a wider conductor pattern). This separation distance only has to be set at a distance that can prevent the switching noise from adversely affecting the control of the control IC 20 in operation.

The conductor pattern 109 coupled to the ground is provided between the second portion 1072 of the conductor pattern 107 and the conductor pattern 104. This can further prevent the second portion 1072 of the conductor pattern 107 and the conductor pattern 104 from being coupled to each other.

Additionally, the component-mounting area Znd2 is also provided between the second portion 1072 of the conductor pattern 107 and the conductor pattern 104, and a component is mounted at the component-mounting area Znd2. This can further prevent the second portion 1072 of the conductor pattern 107 and the conductor pattern 104 from being coupled to each other. As a result, it is possible to further avoid the adverse effect of switching noise on the control by the control IC 20 and consequently further hinder the malfunction of the control IC 20.

(4) The jumper chip 300 provided over the conductor pattern 105 connects the second portion 1072 of the conductor pattern 107 and the conductor pattern 108 to each other, as a result, it is possible to decrease the capacitance caused between the conductor pattern 105 and the conductor pattern in the jumper chip 300. This can prevent the power line pattern TLPB and the feedback line pattern TLFB from being coupled to each other. Consequently, it is possible to further avoid the adverse effect of switching noise on the control by the control IC 20 and consequently further hinder the malfunction of the control IC 20.

(5) The capacitor 60 is provided between the control IC 20 and the switching elements 31 and 32. With this structure, the capacitor 60 hinders spacial electromagnetic field coupling between the control IC 20 and the switching elements 31 and 32. As a result, although the control IC 20 and the switching elements 31 and 32 are close to each other, it is possible to reduce the leakage of switching noise to the control IC 20 and consequently hinder the malfunction of the control IC 20. This means that the malfunction of the control IC 20 can be hindered while the power conversion circuit module 10 is downsized.

(6) The conductor pattern 104 of the first major surface 100S and the conductor pattern 134 of the second major surface 100R are arranged in parallel with each other; the conductor pattern 134 is positioned under the conductor pattern 104 when viewed in plan view as described in (2). Since the circuit board 100 formed of the dielectric is sandwiched between the power line patterns TLP4 and TLPB, a capacitor is formed in shunt connection. The capacitor (the portion equivalently functioning as a capacitor as an electrical circuit) composed of the conductor pattern 104, the conductor pattern 134, and the dielectric is coupled between the ground and the power line pattern TLP4 equivalently functioning as an inductance as an electrical circuit, so that an LC filter is formed; this can prevent the switching noise from being outputted from the output terminal POUT.

Further, in this structure, the capacitor electrically coupled between the output terminal POUT and the ground output terminal POUTG, the capacitor 50, and the capacitor composed of the conductor pattern 104, the conductor pattern 134, and the dielectric together form a π filter. This filter can prevent the switching noise from being outputted from the output terminal POUT.

This capacitor also functions as a part of the output capacitor. As a result, the capacitance of the mounted capacitor component accounts for a small part of the capacitance of the output capacitor 50. The output capacitor 50 can accordingly be downsized and the power conversion circuit module 10 can be downsized. Furthermore, in the power conversion circuit module 10, the output capacitor 50 is implemented as a parallel circuit composed of the capacitors 501 and 502. Thus, in comparison to the case in which a single large capacitor serves as the output capacitor 50, it is also possible to reduce the volume occupied by the output capacitor 50. As such, the power conversion circuit module 10 can be downsized.

In the structure described above, the second portion 1012 of the conductor pattern 101 and the conductor pattern 132 are arranged in parallel to each other and the conductor pattern 132 is positioned under the second portion 1012 of the conductor pattern 101 when viewed in plan view. Additionally, the circuit board 100 formed of the dielectric is sandwiched between the second portion 1012 of the conductor pattern 101 and the conductor pattern 132. As such, the second portion 1012 of the conductor pattern 101, the conductor pattern 132, and the dielectric form an equivalent capacitor as an electrical circuit; in other words, an equivalent capacitor is formed between the capacitor 60 and the portion constituted by the input terminal PIN and the input ground. Further, the capacitor electrically coupled between the input terminal PIN and the input ground, the capacitor 60, and the capacitor composed of the second portion 1012 of the conductor pattern 101, the conductor pattern 132, and the dielectric together form a π filter. This filter reduces the propagation of switching noise.

While in the structure of the present embodiment no ground conductor is formed in the control line patterns, a ground conductor can be formed in a control line pattern. Specifically, a ground conductor may be formed in a gate line pattern coupling the control IC 20 and the gate of the switching element 31 or the gate of the switching element 32.

In this case, a control line pattern includes a ground solid pattern together with the linear conductor patterns described above. In the control line pattern, an electrode pattern is provided at a position adjacent and parallel to not a power line pattern but the ground solid pattern. The line patterns of the control line pattern are arranged opposite to the ground solid pattern. This structure can reduce the leakage of switching noise to the power line pattern.

The control line pattern also includes an identical potential line pattern. The potential at the identical potential line pattern is substantially the same as the potential at the power line pattern. The identical potential line pattern of the control line pattern is connected to a land pattern at which the control IC is mounted. The identical potential line pattern is provided separately from the power line pattern. This structure can reduce the leakage of switching noise caused by the control IC to the power line pattern.

Moreover, while in the present embodiment the control line pattern crosses the current path of the power line pattern, the control line pattern does not necessarily cross the current path of the power line pattern. This can reduce the leakage of switching noise to the power line pattern.

As described above, by using the structure of the present embodiment, it is possible to reduce the module size and also hinder the disturbance of supply voltage due to switching noise additionally transferred to a power line pattern.

Figure 6A:
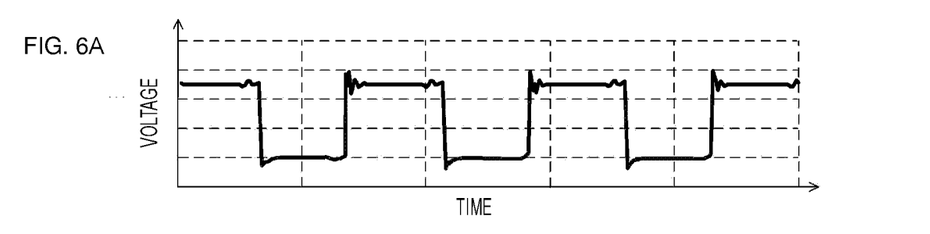
FIG. 6A illustrates a switching waveform.
Figure 6B:
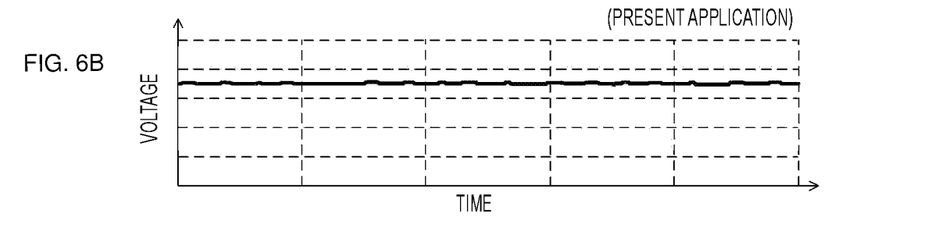
FIG. 6B illustrates a waveform of output voltage according to the present application.
Figure 6C:
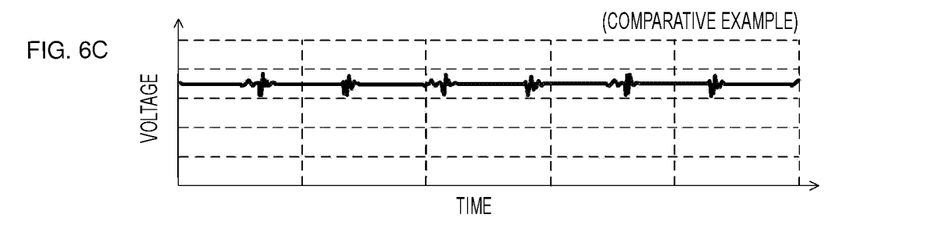
FIG. 6C illustrates a waveform of output voltage of a known comparative structure (not using the structure of the present application)

FIG. 6A illustrates a switching waveform. FIG. 6B illustrates a waveform of output voltage according to the present application. FIG. 6C illustrates a waveform of output voltage of a known comparative structure (not using the structure of the present application). As illustrated in FIGS. 6A and 6C, with the comparative structure, at the time when the switching signal is changed between on and off, noise is added to the output voltage equal to or higher than a given level. By contrast, as illustrated in FIGS. 6A and 6B, with the structure of the present application, the output voltage remains at a constant level regardless of the switching signal being changed between on and off.

Furthermore, by using the structure of the present embodiment, it is possible to hinder the malfunction of the control IC due to switching noise.

It should be noted that the case described above uses a buck DC-DC converter; however, the structure of the circuit board 100 described above can also be applied to a boost DC-DC converter (first applicable circuit), a buck-boost DC-DC converter (second applicable circuit), and a wireless power supply device (third applicable circuit).

(First Applicable Circuit)

Figure 7:
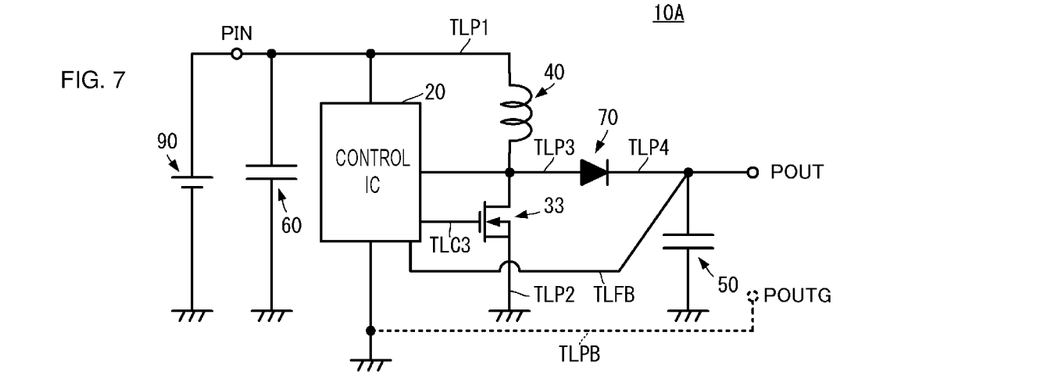
FIG. 7 is an equivalent circuit diagram of an applicable circuit of the structure of the present application.

FIG. 7 is an equivalent circuit diagram of the first applicable circuit of the structure of the present application. The first applicable circuit is a boost DC-DC converter.

As illustrated in FIG. 7, a power conversion circuit module 10A includes the control IC 20, a switching element 33, the inductor 40, the capacitor 50, the capacitor 60, the diode 70, the external-voltage input terminal PIN, and the output terminal POUT. Additionally, the power conversion circuit module 10A virtually includes the ground output terminal POUTG connected to the ground potential, in combination with the output terminal POUT.

The switching element 33 is a semiconductor switch for power supply such as a FET.

The power line pattern TLP1 connects the input terminal PIN, the control IC 20, and one end of the inductor 40. The external DC power supply 90 is coupled to the input terminal PIN. One point of the power line pattern TLP1 between the input terminal PIN and a connection point to the control IC 20 is coupled to the ground (reference potential) via the capacitor 60.

The control IC 20 is coupled to the ground via the grounding line.

A control line pattern TLC3 connects the control IC 20 and the gate of the switching element 33.

The power line pattern TLP3 connects the other end of the inductor 40 and the drain of the switching element 33. This power line pattern TLP3 is also coupled to the control IC 20.

The source of the switching element 33 is coupled to the ground via a power line pattern TLP2.

The anode of the diode 70 is coupled to the power line pattern TLP3. The cathode of the diode 70 is coupled to the output terminal POUT via the power line pattern TLP4.

One point of the power line pattern TLP4 is coupled to the ground (reference potential) via the capacitor 50.

One point of the power line pattern TLP4 is coupled to the control IC 20 via the feedback line pattern (line pattern for sensing output voltage) TLFB.

Additionally, the ground output terminal POUTG is coupled, via a power line pattern TLPB, to the line pattern coupled to the ground from the control IC 20.

Also in such a structure, the power line patterns, the control line pattern TLC3, and the feedback line pattern TLFB are positioned in a similar manner as that of the power conversion circuit module 10 described above, and as a result, it is possible to hamper the output of switching noise and consequently to hinder the malfunction of the control IC 20 due to switching noise.

(Second Applicable Circuit)

Figure 8:
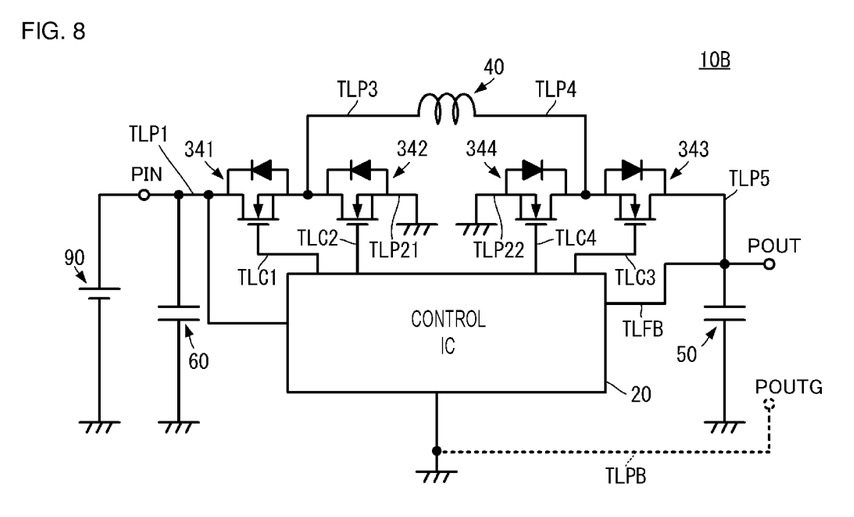
FIG. 8 is an equivalent circuit diagram of an applicable circuit of the structure of the present application.

FIG. 8 is an equivalent circuit diagram of the second applicable circuit of the structure of the present application. The second applicable circuit is a buck-boost DC-DC converter.

As illustrated in FIG. 8, a power conversion circuit module 10B includes the control IC 20, switching elements 341, 342, 343, and 344, the inductor 40, the capacitors 50 and 60, the external-voltage input terminal PIN, and the output terminal POUT. Additionally, the power conversion circuit module 10B virtually includes the ground output terminal POUTG connected to the ground potential, in combination with the output terminal POUT.

The switching elements 341, 342, 343, and 344 are semiconductor switches for power supply such as FETs including built-in diodes.

The power line pattern TLP1 connects the input terminal PIN, the control IC 20, and the drain of the switching element 341. The external DC power supply 90 is coupled to the input terminal PIN. One point of the power line pattern TLP1 between the input terminal PIN and a connection point to the control IC 20 is coupled to the ground (reference potential) via the capacitor 60.

The control IC 20 is coupled to the ground via the grounding line.

The control line pattern TLC1 connects the control IC 20 and the gate of the switching element 341. The control line pattern TLC2 connects the control IC 20 and the gate of the switching element 342. The control line pattern TLC3 connects the control IC 20 and the gate of the switching element 343. A control line pattern TLC4 connects the control IC 20 and the gate of the switching element 344.

The power line pattern TLP3 connects the source of the switching element 341 and the drain of the switching element 342. The source of the switching element 342 is coupled to the ground via a power line pattern TLP21.

The source of the switching element 344 is coupled to the ground via a power line pattern TLP22. The power line pattern TLP4 connects the drain of the switching element 344 and the source of the switching element 343. The drain of the switching element 344 is coupled to the output terminal POUT via a power line pattern TLP5.

One end of the inductor 40 is coupled to the power line pattern TLP3 and the other end is coupled to the power line pattern TLP4.

One point of the power line pattern TLP5 is coupled to the ground (reference potential) via the capacitor 50.

One point of the power line pattern TLP5 is coupled to the control IC 20 via the feedback line pattern (line pattern for sensing output voltage) TLFB.

Additionally, the ground output terminal POUTG is coupled, via the power line pattern TLPB, to the line pattern coupled to the ground from the control IC 20.

Also in such a structure, the power line patterns, the control line patterns TLC1, TLC2, TLC3, and TLC4, and the feedback line pattern TLFB are positioned in a similar manner as that of the power conversion circuit modules 10 and 10A described above, and as a result, it is possible to hamper the output of switching noise and consequently to hinder the malfunction of the control IC 20 due to switching noise.

(Third Applicable Circuit)

Figure 9:
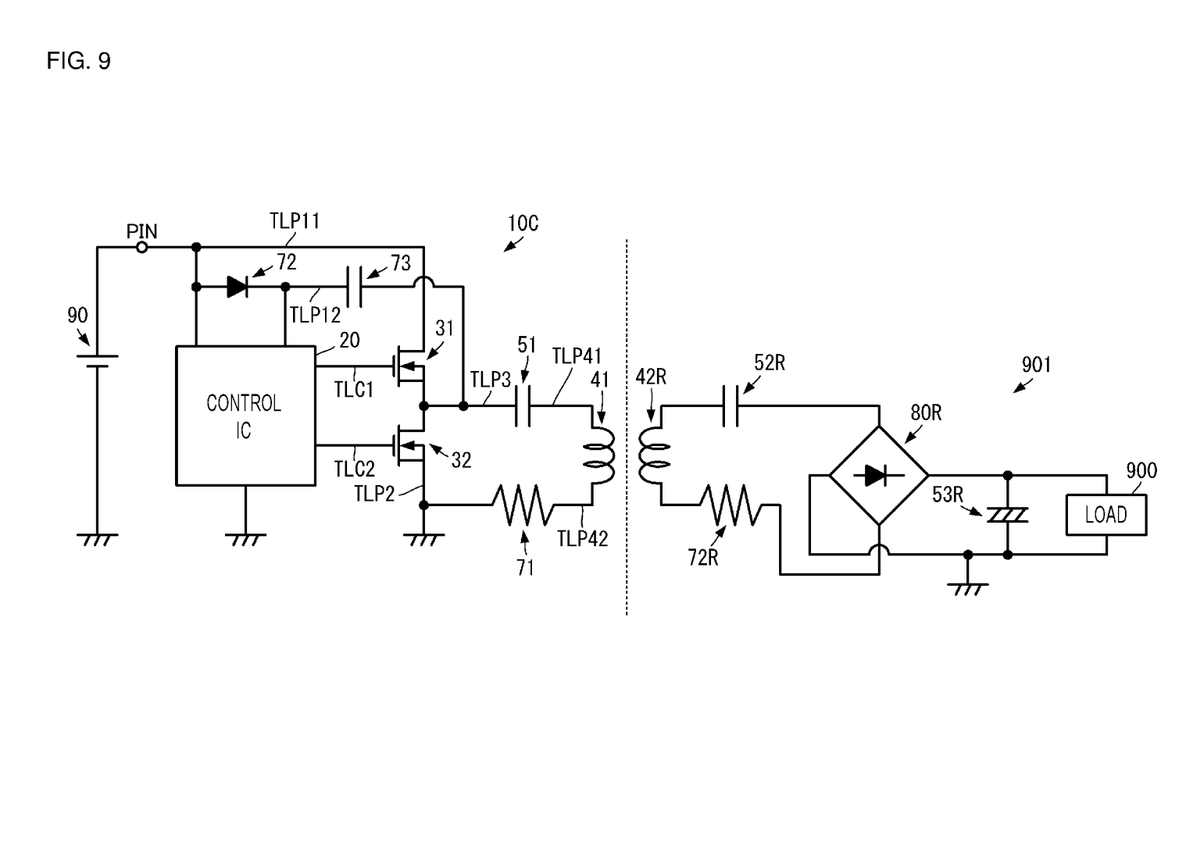
FIG. 9 is an equivalent circuit diagram of an applicable circuit of the structure of the present application.

FIG. 9 is an equivalent circuit diagram of the third applicable circuit of the structure of the present application. The third applicable circuit is a wireless power supply device.

As illustrated in FIG. 9, a power conversion circuit module 10C includes the control IC 20, the switching element 31, the switching element 32, a coil 41, a capacitor 51, a resistor 71, a diode 72, a capacitor 73, and the external-voltage input terminal PIN.

The switching elements 31 and 32 are semiconductor switches for power supply such as FETs.

A power line pattern TLP11 connects the input terminal PIN, the control IC 20, the drain of the switching element 31, and the anode of the diode 72. The external DC power supply 90 is coupled to the input terminal PIN.

A power line pattern TLP12 connects the cathode of the diode 72, one end of the capacitor 73, and one terminal of the control IC 20.

The control IC 20 is coupled to the ground via the grounding line.

The control line pattern TLC1 connects the control IC 20 and the gate of the switching element 31. The control line pattern TLC2 connects the control IC 20 and the gate of the switching element 32.

The power line pattern TLP3 connects the source of the switching element 31 and the drain of the switching element 32. The source of the switching element 32 is coupled to the ground via the power line pattern TLP2.

The other end of the capacitor 73 and one end of the capacitor 51 are coupled to the power line pattern TLP3.

The other end of the capacitor 51 is coupled via the power line pattern TLP41 to one end of the coil 41 for feeding power. The other end of the coil 41 is coupled to one end of the resistor 71 via the power line pattern TLP42. The other end of the resistor 71 is coupled to the power line pattern TLP2. This means that a series circuit composed of the capacitor 51, the coil 41, and the resistor 71 is coupled between the power line patterns TLP3 and TLP2.

Also in such a structure, the power line patterns and the control line patterns TLC1 and TLC2 are positioned in a similar manner as that of the power conversion circuit modules 10, 10A, and 10B described above, and as a result, it is possible to hamper the output of switching noise and consequently to hinder the malfunction of the control IC 20 due to switching noise.

This wireless power supply device is coupled to a power receiving device 901 and supplies power to the power receiving device 901. The power receiving device 901 includes a coil 42R, a capacitor 52R, a resistor 72R, a rectifier circuit 80R, a capacitor 53R, and a load 900. A series circuit composed of the coil 42R, the capacitor 52R, and the resistor 72R is coupled between first and second input terminals of the rectifier circuit 80R. The capacitor 53R and the load 900 are coupled between first and second output terminals of the rectifier circuit 80R.

What is claimed is:

1. A power conversion circuit module comprising:
a switching element for power conversion;
an inductor for power conversion;
an input smoothing capacitor configured to smoothen an input current and an output smoothing capacitor configured to smoothen a switching current;
a control integrated circuit (IC) configured to control the switching element; and
a circuit board having a first major surface at which the switching element or the control IC is mounted and a second major surface different from and opposite to the first major surface, wherein
the circuit board has
a power line pattern electrically connecting the switching element, the inductor, the input smoothing capacitor, and the output smoothing capacitor and being configured as a current path of a power conversion circuit, and
a control line pattern electrically connecting the control IC and a control terminal of the switching element,
the power line pattern is, together with a ground pattern, provided separately from the control line pattern,
the power line pattern includes an outward power line conductor pattern at the first major surface and a return power line conductor pattern at the second major surface,
when the circuit board is viewed in plan view, the outward power line conductor pattern and the return power line conductor pattern are configured as a power line structure in which the outward power line conductor pattern and the return power line conductor pattern are in parallel with and opposite to each other and the return power line conductor pattern is positioned under the outward power line conductor pattern,
a dielectric is provided between the outward power line conductor pattern and the return power line conductor pattern,
the outward power line conductor pattern, the return power line conductor pattern, and the dielectric together are configured as an equivalent capacitor electrically in parallel with the input smoothing capacitor or the output smoothing capacitor, and
a magnetic flux induced by a current flowing through the outward power line conductor pattern and a magnetic flux induced by a current flowing through the return power line conductor pattern cancel each other out.

2. The power conversion circuit module according to claim 1, wherein
the equivalent capacitance and an inductance structurally configured by a line of the power line pattern together are configured as an equivalent LC filter for switching noise caused by switching operation.

3. The power conversion circuit module according to claim 2, wherein
the equivalent capacitance is at a position closer to the output smoothing capacitor than to the switching element with respect to the inductor in the power line pattern electrically connecting the switching element, the inductor, and the output smoothing capacitor.

4. The power conversion circuit module according to claim 2, wherein
the equivalent capacitance is at the power line pattern between the input smoothing capacitor and an input terminal.

5. The power conversion circuit module according to claim 1, wherein
the equivalent capacitance is at a position closer to the output smoothing capacitor than to the switching element with respect to the inductor in the power line pattern electrically connecting the switching element, the inductor, and the output smoothing capacitor.

6. The power conversion circuit module according to claim 5, wherein
the equivalent capacitance is at the power line pattern between the output smoothing capacitor and an output terminal.

7. The power conversion circuit module according to claim 6, wherein
the equivalent capacitance, a capacitor electrically coupled to the output terminal, and the output smoothing capacitor together are configured as a $\pi$ filter.

8. The power conversion circuit module according to claim 1, wherein
the equivalent capacitance is at the power line pattern between the input smoothing capacitor and an input terminal.

9. The power conversion circuit module according to claim 8, wherein
the equivalent capacitance, a capacitor electrically coupled to the input terminal, and the input smoothing capacitor together are configured as a $\pi$ filter.

10. The power conversion circuit module according to claim 1, wherein
the control line pattern is configured as a ground solid pattern and provides not the power line pattern but the ground solid pattern with an electrode pattern at a position adjacent and parallel to the ground solid pattern.

11. The power conversion circuit module according to claim 10, wherein
line patterns of the control line pattern are arranged opposite to the ground solid pattern.

12. The power conversion circuit module according to claim 1, wherein
the control line pattern includes an identical potential line pattern, an electric potential at the identical potential line pattern being identical to an electric potential at the power line pattern, and
the identical potential line pattern extends from a land pattern at which the control IC is mounted and the identical potential line pattern is provided separately from the power line pattern.

13. The power conversion circuit module according to claim 1, wherein
the control line pattern does not overlap any current path of the power line pattern.

14. The power conversion circuit module according to claim 1, wherein
when the circuit board is viewed in plan view, the control line pattern and the power line pattern have a first intersection, and
the control line pattern and the power line pattern cross at the first intersection.

15. The power conversion circuit module according to claim 1, wherein
the control line pattern includes a sensing line pattern for sensing output voltage or current,
when the circuit board is viewed in plan view, the power line pattern and the sensing line pattern has a second intersection,
the sensing line pattern has a break at the second intersection, and
a jumper chip is mounted at a surface at which the sensing line pattern is disposed and the jumper chip connects two ends of the sensing line pattern, the two ends being separated by the break.

16. The power conversion circuit module according to claim 15, wherein
the sensing line pattern is separated from the power line pattern, and
an electrode pattern for installing an electronic component is provided between the sensing line pattern and the power line pattern.

17. The power conversion circuit module according to claim 10, wherein
the control line pattern includes a gate line pattern electrically connecting the control terminal of the switching element and the control IC,
the switching element and the control IC are arranged close to each other, and
the gate line pattern includes a line pattern close and parallel to the ground solid pattern.

18. The power conversion circuit module according to claim 10, wherein
the control line pattern includes a gate line pattern electrically connecting the control terminal of the switching element and the control IC, and
the gate line pattern is positioned opposite to the ground solid pattern and the dielectric is sandwiched between the gate line pattern and the ground solid pattern.

19. The power conversion circuit module according to claim 1, wherein
the dielectric is an insulating plate made of glass fibers impregnated with an epoxy resin and used to configure a glass composite substrate or a glass epoxy substrate.

20. The power conversion circuit module according to claim 1, wherein
the dielectric is an insulating plate made of a polyimide or polyester resin and used to configure a resin substrate.

* * * * *